(12) United States Patent
Yuwaki et al.

(10) Patent No.: US 12,374,863 B2
(45) Date of Patent: Jul. 29, 2025

(54) LIGHT-EMISSION DRIVING DEVICE AND LIGHT-EMITTING DEVICE

(71) Applicant: SONY SEMICONDUCTOR SOLUTIONS CORPORATION, Kanagawa (JP)

(72) Inventors: Takeshi Yuwaki, Kanagawa (JP); Akihito Kamiegawa, Kanagawa (JP); Katsuhisa Daio, Kanagawa (JP); Hayato Kamizuru, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 886 days.

(21) Appl. No.: 17/594,051

(22) PCT Filed: Feb. 10, 2020

(86) PCT No.: PCT/JP2020/005078
§ 371 (c)(1),
(2) Date: Sep. 30, 2021

(87) PCT Pub. No.: WO2020/208927
PCT Pub. Date: Oct. 15, 2020

(65) Prior Publication Data
US 2022/0200237 A1 Jun. 23, 2022

(30) Foreign Application Priority Data
Apr. 12, 2019 (JP) .................................. 2019-076084

(51) Int. Cl.
*H01S 5/068* (2006.01)
*H01S 5/042* (2006.01)
(Continued)

(52) U.S. Cl.
CPC .......... *H01S 5/06821* (2013.01); *H01S 5/042* (2013.01); *H01S 5/0428* (2013.01);
(Continued)

(58) Field of Classification Search
CPC ............. H01S 5/06808; H01S 5/06812; H01S 5/0683; H01S 5/06821; H01S 5/06216; H01S 5/0428; G01S 17/14; G01S 7/484
See application file for complete search history.

(56) References Cited

U.S. PATENT DOCUMENTS

| | | | |
|---|---|---|---|
| 2005/0073268 A1* | 4/2005 | Schrodinger | H04B 10/564 327/66 |
| 2005/0213623 A1* | 9/2005 | Ozasa | H04N 1/40037 372/38.02 |

(Continued)

FOREIGN PATENT DOCUMENTS

| | | |
|---|---|---|
| CN | 109378704 A | 2/2019 |
| DE | 102018106861 A1 | 9/2018 |

(Continued)

OTHER PUBLICATIONS

International Search Report and Written Opinion of PCT Application No. PCT/JP2020/005078, issued on May 12, 2020, 12 pages of ISRWO.

*Primary Examiner* — Minsun O Harvey
*Assistant Examiner* — Fernanda Adriana Camacho Alanis
(74) *Attorney, Agent, or Firm* — CHIP LAW GROUP

(57) ABSTRACT

Provided is a light-emission driving device that includes a light-emission current detection unit, a phase difference detection unit, and a delay unit. The light-emission current detection unit detects a light-emission current for causing a light-emitting element to emit light, the light-emission current being supplied from a light-emission driving unit. The phase difference detection unit detects a phase difference between the detected light-emission current and a drive
(Continued)

signal for controlling the supply of the light-emission current in the light-emission driving unit. The delay unit adjusts propagation delay of the drive signal in accordance with the detected phase difference, and supplies the adjusted drive signal to the light-emission driving unit as a drive signal.

8 Claims, 14 Drawing Sheets

(51) Int. Cl.
    *H01S 5/0683*    (2006.01)
    *H01S 5/40*      (2006.01)
    *G01S 7/481*     (2006.01)

(52) U.S. Cl.
    CPC ........ *H01S 5/06808* (2013.01); *H01S 5/0683* (2013.01); *H01S 5/4025* (2013.01); *G01S 7/4815* (2013.01)

(56) References Cited

U.S. PATENT DOCUMENTS

| 2010/0158055 | A1* | 6/2010 | Giebel ............... G06K 7/10584 |
| | | | 372/29.011 |
| 2018/0278017 | A1 | 9/2018 | Mignoli et al. |
| 2021/0360758 | A1* | 11/2021 | Ueno .................... H05B 45/14 |

FOREIGN PATENT DOCUMENTS

| JP | 2005-268659 A | | 9/2005 |
| JP | 2009236650 A | * | 10/2009 |
| JP | 2012210751 A | * | 11/2012 |
| JP | 2017-191815 A | | 10/2017 |
| JP | 2018-206848 A | | 12/2018 |
| JP | 2019-041201 A | | 3/2019 |
| WO | 2018/221356 A1 | | 12/2018 |

* cited by examiner

LIGHT-EMISSION DRIVING DEVICE AND LIGHT-EMITTING DEVICE

CROSS REFERENCE TO RELATED APPLICATIONS

This application is a U.S. National Phase of International Patent Application No. PCT/JP2020/005078 filed on Feb. 10, 2020, which claims priority benefit of Japanese Patent Application No. JP 2019-076084 filed in the Japan Patent Office on Apr. 12, 2019. Each of the above-referenced applications is hereby incorporated herein by reference in its entirety.

TECHNICAL FIELD

The present disclosure relates to a light-emission driving device and a light-emitting device. Specifically, the present disclosure relates to a light-emission driving device that drives a light-emitting element and to a light-emitting device including the light-emission driving device.

BACKGROUND ART

In the past, in an imaging apparatus such as an in-vehicle camera, a distance measuring device that measures distance to an object has been used. As this distance measuring device, for example, a device that measures a distance by applying a laser beam to an object, detecting light reflected from the object, and measuring the time for the laser beam to go back and forth between the device and the object can be used. In a drive device of a light-emitting element used in such a distance measuring device, fluctuation in light-emission delay time of the light-emitting element becomes a problem. This is because an error in distance measurement is caused by the fluctuation.

As such a drive device, for example, a drive device that performs, when setting a target current for obtaining desired light-emission intensity in distance measurement, the setting of the target current in accordance with background light at the time when the light-emitting element is in a non-emission state or the properties of the light-emitting element has been proposed (see, for example, Patent Literature 1.). In this existing technology, setting of a bias current corresponding to a light-emission threshold value of the light-emitting element in addition to the target current is further performed. A drive current of the light-emitting element is controlled on the basis of the set target current and bias current. Errors in distance measurement due to an error of the target current or the like are reduced.

CITATION LIST

Patent Literature

Patent Literature 1: Japanese Patent Application Laid-open No. 2019-041201

DISCLOSURE OF INVENTION

Technical Problem

The above-mentioned existing technology has a problem that errors in distance measurement in the case where the delay time of the drive signal of the light-emitting element has fluctuated cannot be reduced. When distance measurement is performed, a signal for controlling the light emission is output from a processing device that executes distance measurement to the drive device of the light-emitting element. When the delay time between the output timing of this signal and the light-emission timing of the light-emitting element fluctuates, an error in distance measurement occurs. The above-mentioned existing technology has a problem that such errors caused by the fluctuation in the delay time cannot be reduced.

The present disclosure has been made in view of the above-mentioned problem, and an object of the present disclosure to reduce errors caused by changes in delay time when driving a light-emitting element.

Solution to Problem

The present disclosure has been made in order to solve the above-mentioned problem, and a first aspect thereof is a light-emission driving device, including: a light-emission current detection unit that detects a light-emission current for causing a light-emitting element to emit light, the light-emission current being supplied from a light-emission driving unit; a phase difference detection unit that detects a phase difference between the detected light-emission current and a drive signal for controlling the supply of the light-emission current in the light-emission driving unit; and a delay unit that adjusts propagation delay of the drive signal in accordance with the detected phase difference, and supplies the adjusted drive signal to the light-emission driving unit as a drive signal.

Further, in this first aspect, the light-emission driving device may further include a simulation drive unit that is controlled by the adjusted drive signal to supply a current that is substantially synchronized with the light-emission current, in which the light-emission current detection unit may detect the light-emission current by detecting the current supplied from the simulation drive unit.

Further, in this first aspect, the light-emission driving unit may stop the supply of the light-emission current in a non-light-emission period that is a period in which light emission of the light-emitting element is stopped.

Further, in this first aspect, the delay unit may be configured by cascading a plurality of delay circuits in which time of the propagation delay changes depending on the phase difference.

Further, in this first aspect, the light-emission driving device may further include a second light-emission driving unit that is connected to the light-emission driving unit in parallel to supply a second light-emission current to the light-emitting element.

Further, in this first aspect, the light-emission driving device may further include a second drive signal generation unit that generates, on the basis of the adjusted drive signal, a second drive signal that is a drive signal of the second light-emission driving unit.

Further, in this first aspect, the light-emission driving device may further include a reception unit that receives the drive signal transmitted through a signal line and outputs the received drive signal, in which the phase difference detection unit may detect a difference between the detected light-emission current and the drive signal output from the reception unit, and the delay unit may adjust delay of the drive signal output from the reception unit.

Further, in this first aspect, the signal line may transmit the drive signal converted into a differential signal, and the reception unit may receive the transmitted drive signal converted into a differential signal.

Further, in this first aspect, the light-emission current detection unit may include a buffer circuit having substantially the same delay time as output delay time of driving in the reception unit.

Further, a second aspect of the present disclosure is a light-emitting device, including: a light-emitting element; a light-emission driving unit that supplies a light-emission current for causing the light-emitting element to emit light; a light-emission current detection unit that detects the supplied light-emission current; a phase difference detection unit that detects a phase difference between the detected light-emission current and a drive signal for controlling the supply of the light-emission current in the light-emission driving unit; and a delay unit that adjusts propagation delay of the drive signal in accordance with the detected phase difference, and supplies the adjusted drive signal to the light-emission driving unit as a drive signal.

By employing the aspects described above, the effect of adjusting delay time of a drive signal in accordance with a phase difference between the drive signal and a light-emission current and supplying the adjusted drive signal to a light-emission driving unit is provided. The phase difference between the drive signal and the light-emission current is assumed to be adjusted.

MODE(S) FOR CARRYING OUT THE INVENTION

Next, embodiments for carrying out the present disclosure (hereinafter, referred to as embodiments) will be described with reference to the drawings. In the following drawings, the same or similar portions will be denoted by the same or similar reference symbols. Further, the embodiments will be described in the following order.
1. First Embodiment
2. Second Embodiment
3. Third Embodiment
4. Fourth Embodiment
5. Application example to camera

1. First Embodiment

[Light-Emitting Device]

Figure 1:
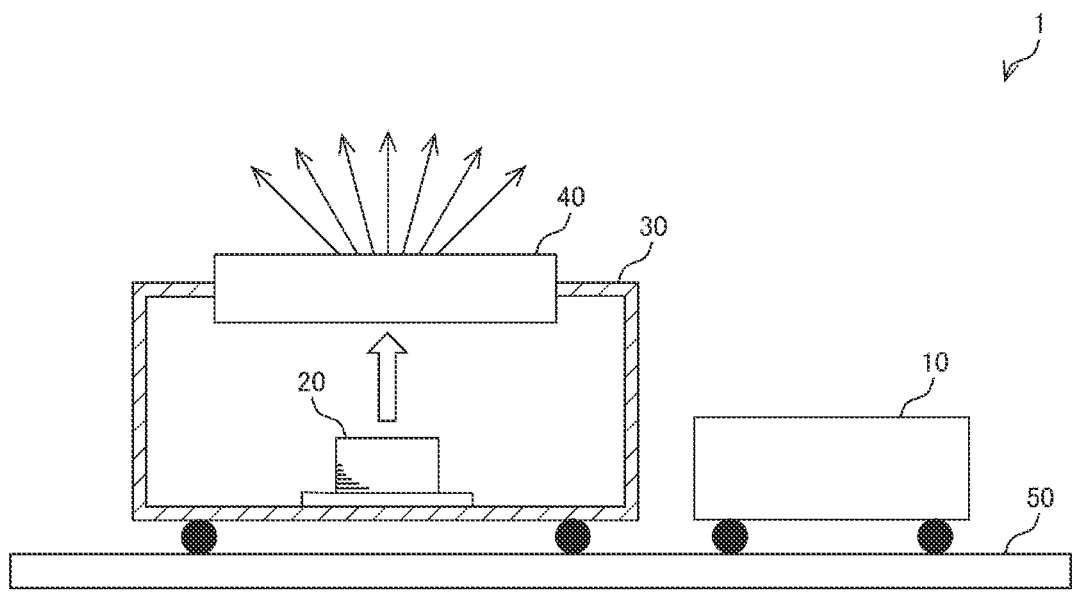
FIG. 1 is a diagram showing a configuration example of a light-emitting device according to an embodiment of the present disclosure.

FIG. 1 is a diagram showing a configuration example of a light-emitting device according to an embodiment of the present disclosure. FIG. 1 is a diagram showing an outline of a light-emitting device 1. The light-emitting device 1 in the figure includes a light-emitting element 20, a light emission unit 40, a casing 30, a light-emission driving device 10, and a substrate 50. The light-emitting device 1 is, for example, a light-emitting device used as a device that measures a distance between the device and an object by a ToF (Time of Flight) method in a camera or the like. Here, the ToF method is a method of measuring a distance by applying a laser beam to an object and measuring the period for the laser beam to go back and forth between the device and the object. Further, the light-emitting device 1 can be used also as a device that recognizes a three-dimensional shape of an object using the reflected laser beam.

The light-emitting element 20 is disposed in the casing 30 and emits a laser beam. The light emission unit 40 is disposed on the top plate of the casing 30. This light emission unit 40 protects the light-emitting element 20 and causes a laser beam to be transmitted therethrough. Further, a diffusion plate is disposed in the light emission unit 40 and converts the laser beam from the light-emitting element 20 into diffused light beams. A laser beam of point (one-dimensional) emission is converted into laser beams of plane (two-dimensional) emission by this light emission unit 40. The laser beams of plane emission are applied to an object, and three-dimensional mapping of the object can be performed by imaging the laser beams reflected by the object and acquiring distance information for each pixel of an image sensor. An outlined arrow in the figure represents the laser beam emitted by the light-emitting element 20, and solid arrows represent the laser beams converted into diffused light beams by the light emission unit 40.

The light-emission driving device 10 is an electronic circuit for driving the light-emitting element 20. The light-emission driving device 10 and the casing 30 are mounted on the substrate 50. FIG. 1 shows an example in which they are mounted by using solder balls.

In such a light-emitting device 1, in order to improve the accuracy for measuring a distance, there is a need to improve the accuracy for measuring the time from when a laser beam is applied to when reflected light is detected. A timer or the like is used for the time measurement, and the time measurement is started with reference to the output of a drive signal for light-emission-driving the light-emitting element 20. There is delay time from when a drive signal is output to when application of a laser beam by the light-emitting element 20 is started. When this delay time fluctuates, the accuracy for measuring the time is reduced, and also the accuracy for measuring a distance is reduced. In this regard, in the light-emitting device 1 in the figure, the delay time to when application of a laser beam by the light-emitting element 20 is started is stabilized.

[Light-Emission Driving Device]

Figure 2:
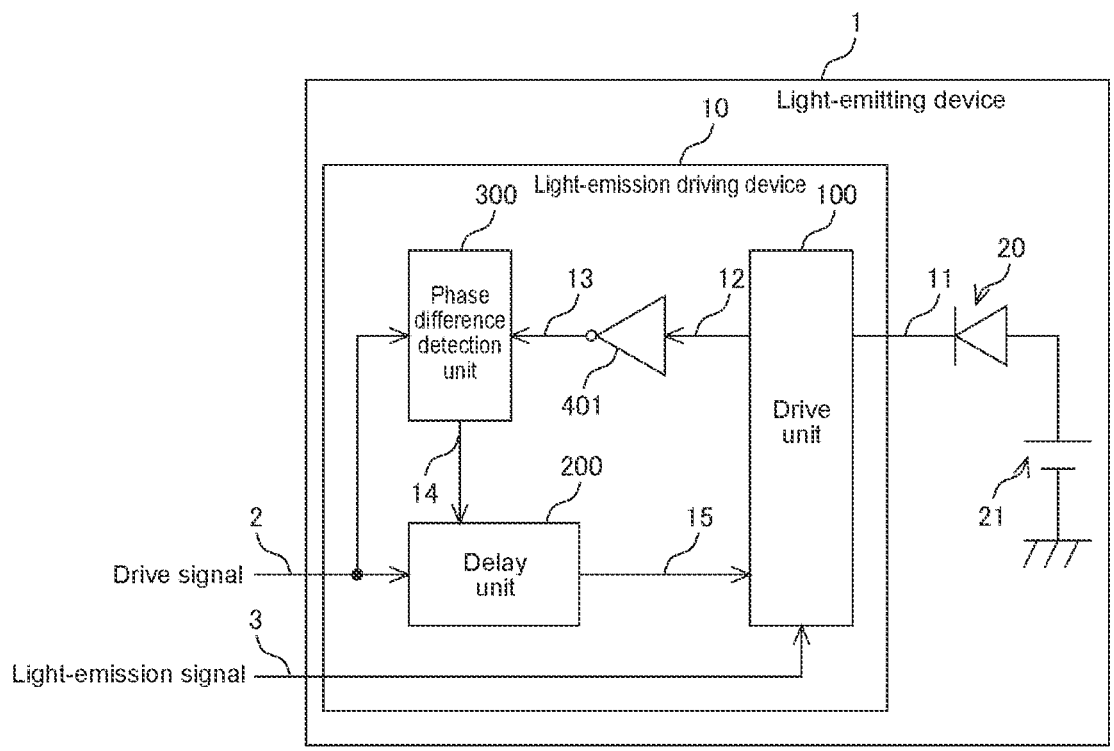
FIG. 2 is a diagram showing a configuration example of a light-emission driving device according to a first embodiment of the present disclosure.

FIG. 2 is a diagram showing a configuration example of a light-emission driving device according to a first embodiment of the present disclosure. FIG. 2 is a diagram showing a configuration example of the light-emitting device 1 and the light-emission driving device 10. The light-emitting device 1 in the figure includes the light-emitting element 20, a power source unit 21, and the light-emission driving device 10.

The light-emitting element 20 is a light-emitting element that emits a laser beam as described above. This light-emitting element 20 can be caused to emit light by causing a specified light-emission current to flow in the light-emitting element 20. Hereinafter, the period during which the light-emitting element 20 is caused to emit light will be referred to as the light-emission period, and the period in which the light emission of the light-emitting element 20 is stopped will be referred to as the non-light-emission period. As this light-emitting element 20, for example, a laser diode can be used. The light-emission current is a current having a value equal to or higher than a light emission threshold value of the light-emitting element 20 and is a current for achieving light emission of desired light intensity. The power source unit 21 is for supplying power for causing a light-emission current to flow in the light-emitting element 20. A constant-voltage source can be applied to the power source unit 21. One end of the power source unit 21 in the figure is grounded, and a power supply voltage of a positive polarity is applied to the anode of the light-emitting element 20. Note that the cathode of the light-emitting element 20 is connected to the light-emission driving device 10 via a wiring 11.

The light-emission driving device 10 in the figure includes a drive unit 100, a delay unit 200, a phase difference detection unit 300, and an inversion buffer 401. Signal lines 2 and 3 are connected to the light-emission driving device 10 in the figure. The signal lines 2 and 3 are signal lines for respectively transmitting a drive signal and a light-emission signal. The drive signal is a signal for controlling the supply of the light-emission current to the light-emitting element 20. This drive signal can include, for example, a continuous square wave. The period in which the voltage of the square wave is at a high level can be caused to correspond to the period in which the light-emission current is fed to the light-emitting element 20. Further, the light-emission current is a current for causing the light-emitting element 20 to emit light. Further, the light-emission signal is a signal representing the light-emission period. The light-emission signal can include, for example, a square wave. The periods in which the voltage of the square wave is at a high level and a low level can be caused to respectively correspond to the light-emission period and the non-light-emission period. These signals are supplied from a distance measuring device or the like that uses the light-emitting device 1.

The delay unit 200 is for delaying the input drive signal. This delay unit 200 adjusts the delay time of the drive signal transmitted through the signal line 2 and outputs the drive signal whose delay time has been adjusted. This signal is output via the wiring 15. The adjustment of the delay time is performed on the basis of the signal output from the phase difference detection unit 300 described below. Details of the configuration of the delay unit 200 will be described below.

The drive unit 100 is for driving the light-emitting element 20. This drive unit 100 performs driving by supplying a light-emission current to the light-emitting element 20 connected via the wiring 11. The supply of the light-emission current to the light-emitting element 20 is controlled on the basis of the drive signal output from the delay unit 200. Further, the drive unit 100 supplies the light-emission current on the basis of the light-emission signal transmitted through the signal line 3. Details of the configuration of the drive unit 100 will be described below.

The inversion buffer 401 is for detecting a light-emission current when the drive unit 100 drives the light-emitting element 20. This inversion buffer 401 detects the light-emission current via a wiring 12. The logic of the detected light-emission current is inverted by the inversion buffer 401 and output via a wiring 13. Note that the inversion buffer 401 and the wiring 12 are an example of the light-emission current detection unit described in the claims.

The phase difference detection unit 300 is for detecting a phase difference between a drive signal and a light-emission current. This phase difference detection unit 300 detects a phase difference between the drive signal transmitted through the signal line 2 and the light-emission current detected by the inversion buffer 401, and outputs the signal corresponding to the detected phase difference. This signal is output via a wiring 14. Details of the configuration of the phase difference detection unit 300 will be described below.

The delay unit 200, the drive unit 100, the inversion buffer 401, and the phase difference detection unit 300 constitute a DLL (Delay Locked Loop). This DLL causes the light-emission signal and the drive signal to be synchronized with each other, and the light emission of the light-emitting element 20 can be synchronized with the drive signal.

[Drive Unit]

Figure 3:
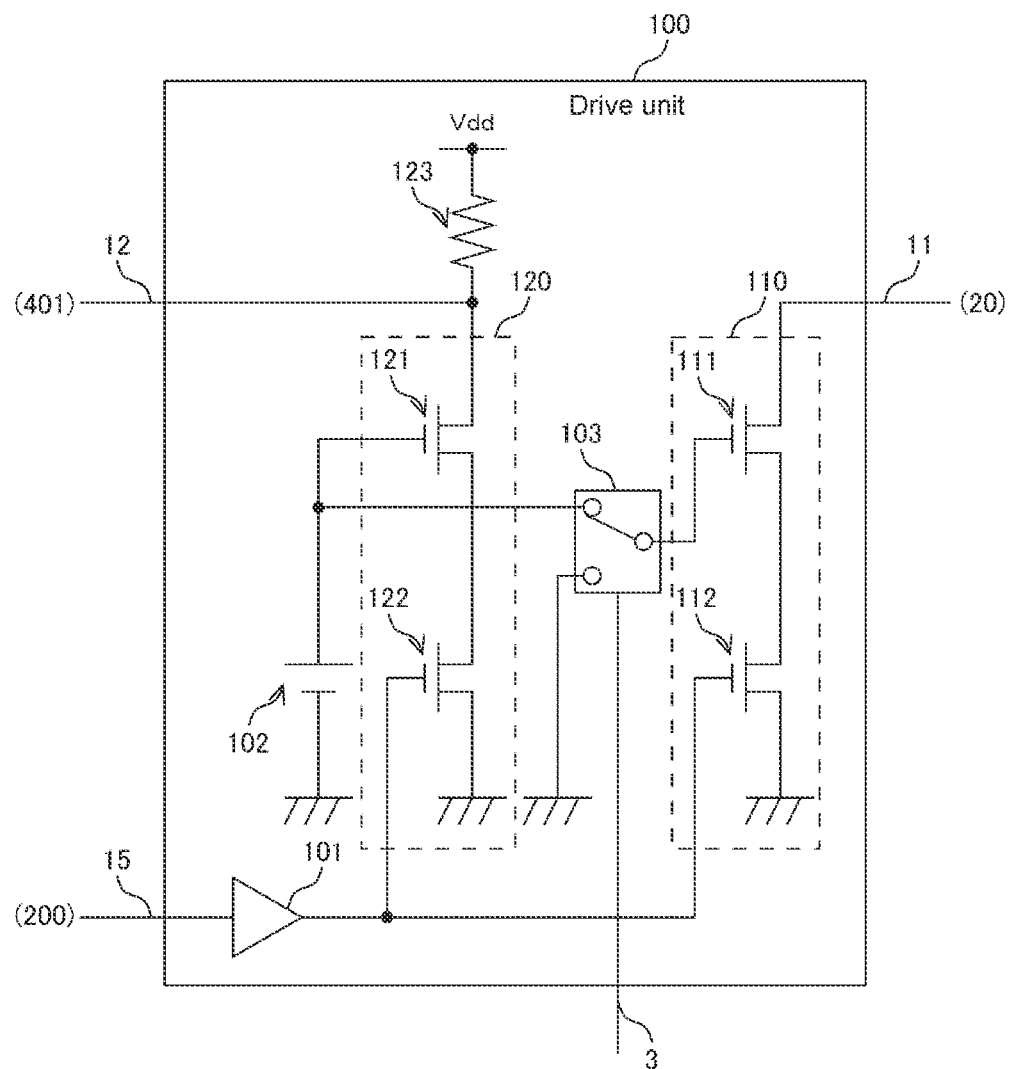
FIG. 3 is a diagram showing a configuration example of a drive unit according to the first embodiment of the present disclosure.

FIG. 3 is a diagram showing a configuration example of a drive unit according to the first embodiment of the present disclosure. FIG. 3 is a circuit diagram showing a configuration example of the drive unit 100. The drive unit 100 in the figure includes MOS transistors 111, 112, 121, and 122, a non-inversion buffer 101, a selection unit 103, a voltage source 102, and a resistance 123. As the MOS transistors 111, 112, 121, and 122, n-channel MOS transistors can be used. Further, in the drive unit 100, a power supply line Vdd is disposed. This power supply line Vdd is wiring for supplying power of the drive unit 100.

The input of the non-inversion buffer 101 is connected to the wiring 15, and the output of the non-inversion buffer 101 is connected to the gate of the MOS transistor 122 and the gate of the MOS transistor 112. The source of the MOS transistor 112 is grounded, and the drain of the MOS transistor 112 is connected to the source of the MOS transistor 111. The drain of the MOS transistor 111 is connected to the wiring 11, and the gate of the MOS transistor 111 is connected to the output of the selection unit 103. The control input of the selection unit 103 is connected to the signal line 3. One input of the selection unit 103 is grounded, and the other input of the selection unit 103 is connected to one end of the voltage source 102 and the gate of the MOS transistor 121. The other end of the voltage source 102 is grounded. The source of the MOS transistor 121 is connected to the drain of the MOS transistor 122, and the drain of the MOS transistor 121 is connected to the wiring 12 and one end of the resistance 123. The other end of the resistance 123 is connected to the power supply line Vdd. The source of the MOS transistor 122 is grounded.

The voltage source 102 is a power source for supplying a bias voltage to the gates of the MOS transistors 111 and 121. This voltage source 102 supplies a bias voltage of a positive polarity.

The selection unit 103 is for selecting a signal input to one of two input terminals and outputs the selected signal from an output terminal. This selection unit 103 selects the signal on the basis of the light-emission signal connected to the control input. For example, the selection unit 103 is capable of selecting a bias voltage of the voltage source 102 when the voltage of the light-emission signal is at a high level, and selecting a ground voltage when the voltage of the light-emission signal is at a low level. In this way, a bias voltage is selected in the light-emission period represented by the light-emission signal, and input to the gate of the MOS transistor 111.

The MOS transistors 111 and 112 constitute a light-emission driving unit 110, and supplies a light-emission current to the light-emitting element 20 connected to the wiring 11. The light-emission driving unit 110 in the figure supplies a sink current as a light-emission current. As described above, the gate of the MOS transistor 111 is connected to the voltage source 102 via the selection unit 103. A bias voltage is supplied to the gate of the MOS transistor 111 in the light-emission period. For this reason, a drain current corresponding to the supplied bias voltage flows to the MOS transistor 111. In this way, the MOS transistor 111 operates as a constant-current circuit for supplying a constant drain current. By setting the bias voltage of the voltage source 102 such that the drain current of the MOS transistor 111 is a current exceeding a light-emission threshold value of the light-emitting element 20, it is possible to supply a light-emission current. Meanwhile, the gate of the MOS transistor is grounded in the non-light-emission period, the MOS transistor 111 enters the non-conductive state. As a result, the supply of the light-emission current in the non-light-emission period is stopped.

The MOS transistor 112 is a MOS transistor that is connected to the MOS transistor 111 in series and controls the supply of a light-emission current. The MOS transistor 112 enters the conductive state when the voltage of the drive signal applied to the gate is at a high level, and the light-emission current is supplied via the wiring 11. Meanwhile, when the voltage of the drive signal is at a low level, the MOS transistor 112 enters the non-conductive state, and the supply of the light-emission current is stopped. As described above, the light-emission driving unit 110 supplies the light-emission current when the light-emission signal and the drive signal are at a high level.

The MOS transistors 121 and 122 constitute a simulation drive unit 120. This simulation drive unit 120 is for supplying a current that is substantially synchronized with the light-emission current supplied by the light-emission driving unit 110. This simulation drive unit 120 supplies a current that flows to the resistance 123. A drive signal is applied to the gate of the MOS transistor 122, and the MOS transistor 122 transitions to the conductive state and the non-conductive state at substantially the same time with the MOS transistor 112. Further, the MOS transistor 121 constitutes a constant-current circuit similarly to the MOS transistor 111. A bias voltage is constantly applied to the gate of the MOS transistor 121. By adjusting the channel width of this MOS transistor 121, the drain current of the MOS transistor 121 can be adjusted. For example, by setting the channel width of the MOS transistor 121 to 1/N of the MOS transistor 111, the drain current of the MOS transistor 121 can be set to 1/N of the MOS transistor 111. As described above, the simulation drive unit 120 is capable of supplying a current different from that of the light-emission driving unit 110. By setting the current supplied by the simulation drive unit 120 to low, the power consumption can be reduced. Further, since a bias voltage is constantly applied to the gate of the MOS transistor 121, a current can be supplied to the resistance 123 even in the non-light-emission period.

By detecting the voltage drop by the resistance 123, the light-emission current can be detected. Specifically, instead of detecting the voltage of the wiring 11 connected to the drain of the MOS transistor 111 of the light-emission driving unit 110 through which the light-emission current flows, the voltage of the node connecting the drain of the MOS transistor 121 and the resistance 123 through which the current that is substantially synchronized with the light-emission current flows to each other is detected. As a result, the light-emission current that changes depending on the drive signal can be detected, and the phase of the light-emission current can be detected. The wiring 12 is connected to the node connecting the drain of the MOS transistor 121 and the resistance 123 to each other, and the detected light-emission current is transmitted to the input of the inversion buffer 401 described in FIG. 2. Since the voltage of the node connecting the drain of the MOS transistor 121 and the resistance 123 to each other is out of phase with the light-emission current, the logic is inverted by the inversion buffer 401.

By disposing the simulation drive unit 120, the light-emission signal can be supplied to the phase difference detection unit 300 even in the non-light-emission period. A closed loop can be maintained in the above-mentioned DLL, and the phase synchronization state (lock) can be maintained. Meanwhile, in the case where the light-emission signal is detected from the light-emission driving unit 110, detection of the light-emission signal is lost in the non-light-emission period. After that, when transitioning to the light-emission period, the drive signal and the light-emission signal are in the non-synchronization state, and it takes time for both phases to synchronize with each other. For this reason, delay occurs in starting distance measurement.

Note that the configuration of the simulation drive unit 120 is not limited to this example. For example, a semiconductor element, e.g., a diode, can be disposed instead of the resistance 123. It is suitable to dispose, as this diode, a diode having the same configuration as that of the light-emitting element 20, e.g., a diode formed of the same compound semiconductor. This is because a load having the same properties as those of the light-emitting element 20 can be connected to the simulation drive unit 120 and the temperature property and the like can be made similar to those of the light-emitting element 20. Further, instead of the power supply through the power supply line Vdd, the power of the power source unit 21 described in FIG. 1 can be supplied to the resistance 123. Further, the channel width of the MOS transistor 121 can be made the same as that of the MOS transistor 111.

[Delay Unit]

Figure 4:
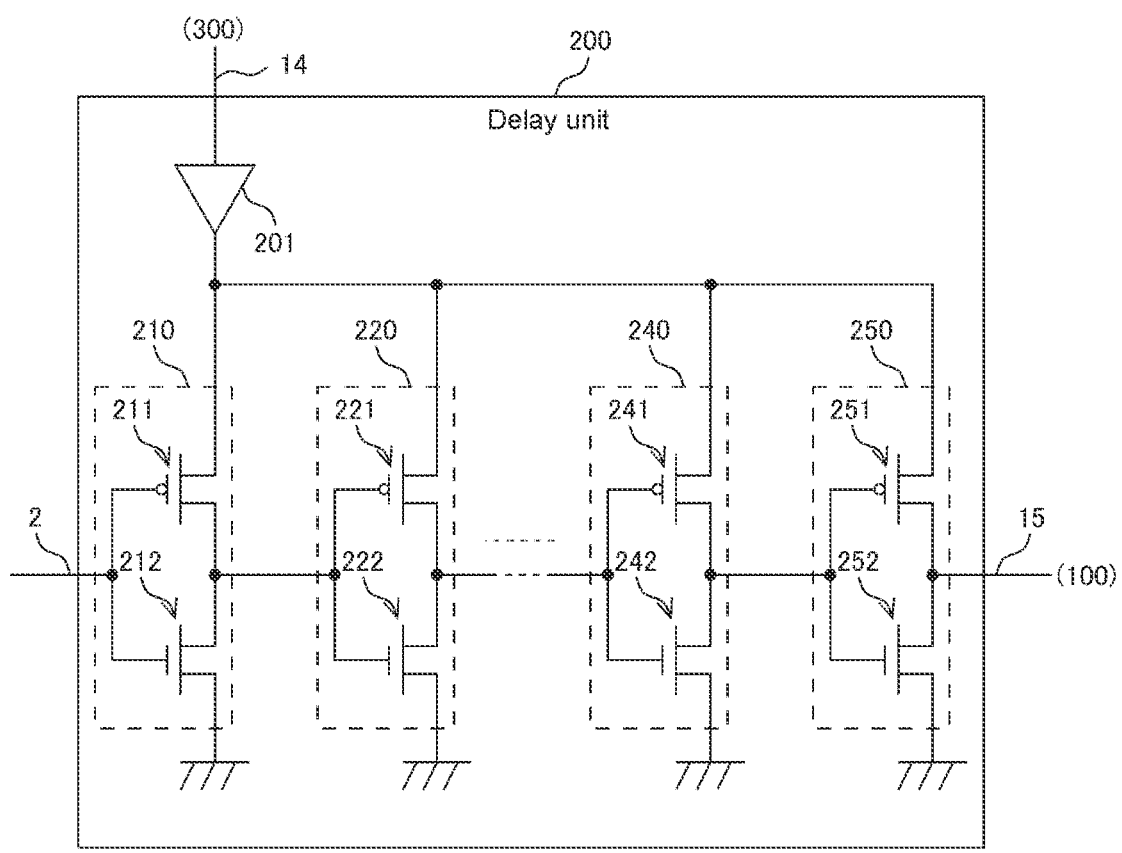
FIG. 4 is a diagram showing a configuration example of a delay unit according to an embodiment of the present disclosure.

FIG. 4 is a diagram showing a configuration example of a delay unit according to the embodiment of the present disclosure. FIG. 4 is a circuit diagram showing a configuration example of the delay unit 200. The delay unit 200 in the figure includes a non-inversion buffer 201 and a plurality of inverter circuits (inverter circuits 210, 220, 240, and 250).

The non-inversion buffer 201 is a buffer that distributes the signal from the phase difference detection unit 300 to the plurality of inverter circuits. As will be described below, the signal from the phase difference detection unit 300 is a signal of a voltage corresponding to the phase difference between a drive signal and a light-emission current, and is a signal that rises when the light-emission signal is in a lag phase with respect to the drive signal and drops when the light-emission signal is in a lead phase with respect to the drive signal. This signal is distributed as the power of the respective inverter circuits by the non-inversion buffer 201.

The plurality of inverter circuits is cascaded between the signal line 2 and the wiring 15. The configurations of the respective inverter circuits will be described taking the inverter circuit 210 as an example. The inverter circuit 210 includes MOS transistors 211 and 212. As the MOS transistors 211 and 212, a p-channel MOS transistor and an n-channel MOS transistor can be used. The gates of the MOS transistors 211 and 212 are common-connected to each other to constitute an input node. The drains of the MOS transistors 211 and 212 are common-connected to each other constitute an output node. The input node of the inverter circuit 210 is connected to the signal line 2, and the output node of the inverter circuit 210 is connected to the input node of the inverter circuit 220 at the next stage. The source of the MOS transistor 211 is connected to the output of the non-inversion buffer 201, and the source of the MOS transistor 212 is grounded.

The inverter circuit 210 or the like inverts the logic of the input drive signal and outputs the inverted signal. The output of the inverted drive signal causes propagation delay. This propagation delay can be changed by controlling the power supply voltage of the inverter circuit 210. This is because the transfer function of the MOS transistors 211 and 212 is changed by the power supply voltage. As the power supply voltage is higher, the driving performance of the MOS transistor 211 or the like increases and the propagation delay is shortened. By cascading many inverter circuits 210, it is possible to achieve relatively large delay time. Further, in accordance with the output signal of the phase difference detection unit 300, it is possible to adjust the delay time of the drive signal. The drive signal whose delay time has been adjusted is output to the drive unit 100 via the wiring 15.

Note that the delay circuit of the delay unit 200 needs to include a plurality of inverter circuit 210 or the like in order to make the polarity of the drive signal transmitted through the signal line 2 and the polarity the drive signal input to the gate of the MOS transistor 112 of the drive unit 100 match with each other. Further, the non-inversion buffer 201 may amplify the signal from the phase difference detection unit 300 and distribute the amplified signal to the respective inverter circuits. As a result, it is possible to improve the loop gain of the DLL.

[Delay Property]

Figure 5:
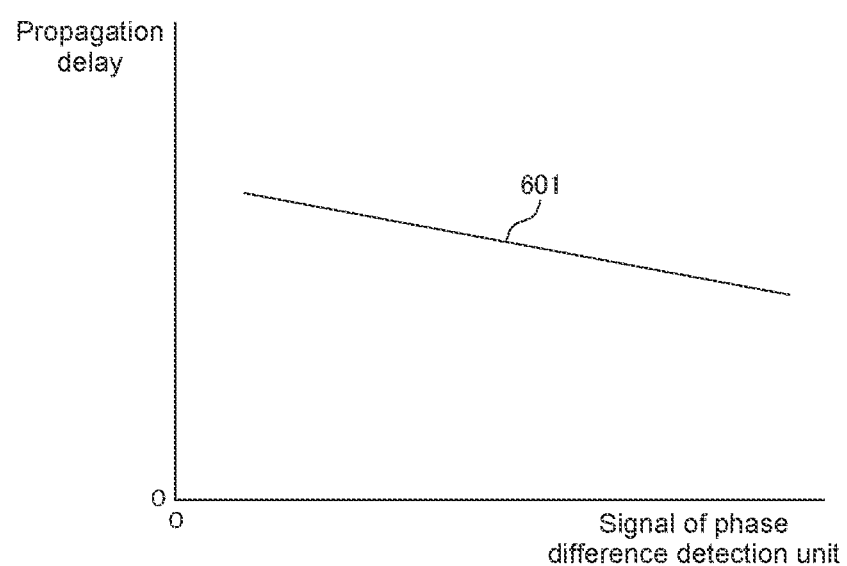
FIG. 5 is a diagram showing an example of delay by the delay unit according to the embodiment of the present disclosure.

FIG. 5 is a diagram showing an example of delay by the delay unit according to the embodiment of the present disclosure. FIG. 5 is a diagram showing the relationship between the output signal of the phase difference detection unit 300 and the propagation delay of the delay unit 200. The horizontal axis of the figure indicates the voltage of the output signal of the phase difference detection unit 300. The vertical axis of the figure indicates the propagation delay time of the delay unit 200. As shown in a graph 601 of the figure, the propagation delay of the delay unit 200 is shortened when the voltage of the output signal of the phase difference detection unit 300 increases.

[Phase Difference Detection Unit]

Figure 6:
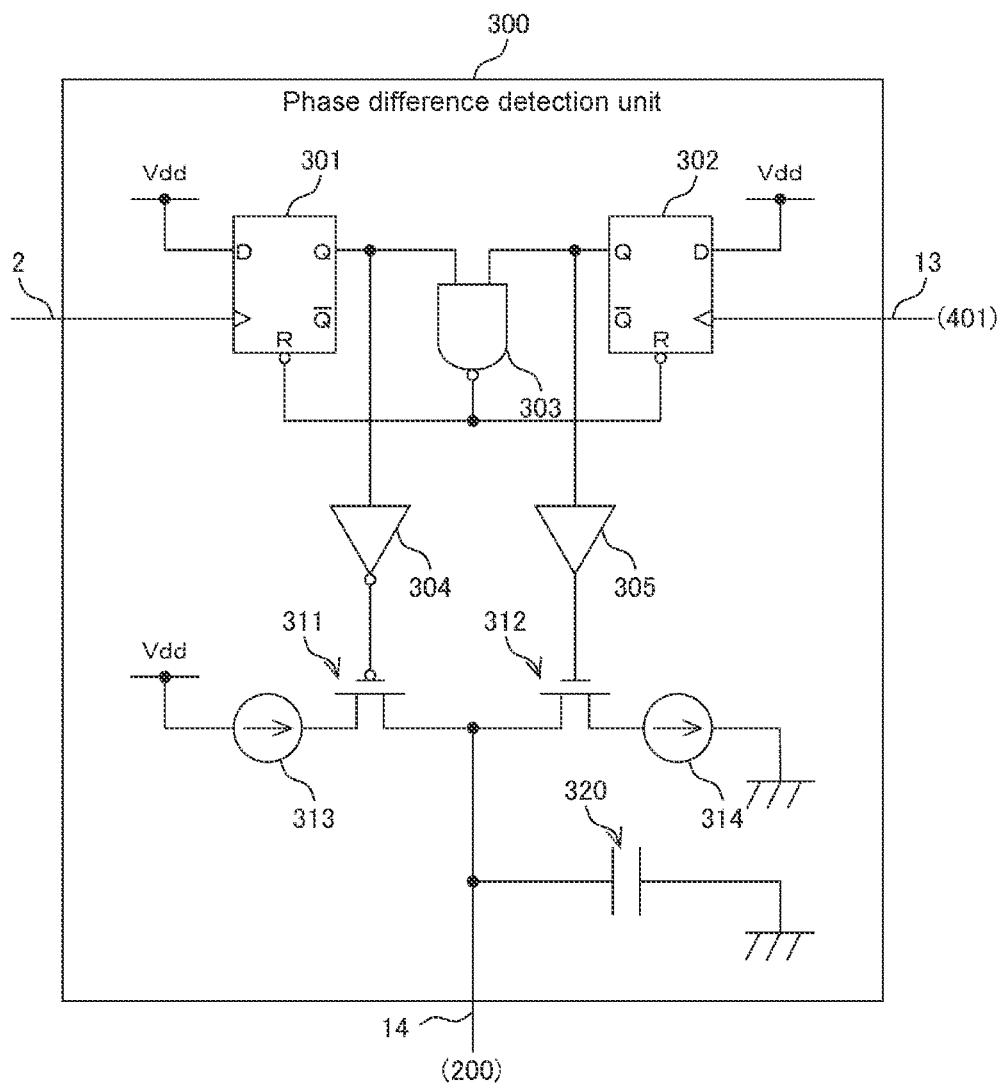
FIG. 6 is a diagram showing a configuration example of a phase difference detection unit according to the embodiment of the present disclosure.

FIG. 6 is a diagram showing a configuration example of a phase difference detection unit according to the embodiment of the present disclosure. FIG. 6 is a circuit diagram showing a configuration example of the phase difference detection unit 300. The phase difference detection unit 300 in the figure includes flip-flops 301 and 302, a NAND gate 303, an inversion buffer 304, a non-inversion buffer 305, MOS transistors 311 and 312, and constant-current circuits 313 and 314. Further, the phase difference detection unit 300 in the figure further includes a capacitor 320. As the flip-flops 301 and 302, D-type flip-flops can be used. As the MOS transistors 311 and 312, a p-channel MOS transistor and an n-channel MOS transistor can be used.

The D inputs of the flip-flops 301 and 302 are connected to the power supply line Vdd. The reset (R) inputs of the flip-flops 301 and 302 are common-connected to the output of the NAND gate 303. The clock input of the flip-flop 301 is connected to the signal line 2, and the Q output of the flip-flop 301 is connected to the input of the inversion buffer 304 and one input of the NAND gate 303. The other input of the NAND gate 303 is connected to the Q output of the flip-flop 302 and the input of the non-inversion buffer 305. The clock input of the flip-flop 302 is connected to the wiring 13. The gate of the MOS transistor 311 is connected to the output of the inversion buffer 304, and the source of the MOS transistor 311 is connected to one end of the constant-current circuit 313. The other end of the constant-current circuit 313 is connected to the power supply line Vdd.

The drain of the MOS transistor 311 is connected to the drain of the MOS transistor 312, one end of the capacitor 320, and the wiring 14. The other end of the capacitor 320 is grounded. The gate of the MOS transistor 312 is connected to the output of the non-inversion buffer 305, and the source of the MOS transistor 312 is connected to the one end of the constant-current circuit 314. The other end of the constant-current circuit 314 is grounded.

The flip-flops 301 and 302 and the NAND gate 303 constitute a phase comparison circuit. Of the signals of the clock inputs of the flip-flops 301 and 302, the Q output of the flip-flop to which the signal in a lead phase is input is inverted first, and a signal of a value "1" is output to one of the inversion buffer 304 and the non-inversion buffer 305. When the signal in a lag phase, of the signals of the clock inputs of the flip-flops 301 and 302, is input, the flip-flops 301 and 302 are simultaneously reset. As a result, a signal of a value "1" is output to the inversion buffer 304 or the like connected to the flip-flops 301 and 302 to which the signal in a lead phase is input.

The inversion buffer 304 is a buffer that transmits the output of the flip-flop 301 to the gate of the MOS transistor 311 to drive the MOS transistor 311. The non-inversion buffer 305 is a buffer that transmits the output of the flip-flop 302 to the gate of the MOS transistor 312 to drive the MOS transistor 312.

The MOS transistors 311 and 312 and the constant-current circuits 313 and 314 constitute a charge pump circuit. When the MOS transistor 311 enters the conductive state, the source current by the constant-current circuit 313 connected to the source is output to the wiring 14. Meanwhile, the MOS transistor 312 enters the conductive state, the sink current by the constant-current circuit 314 connected to the source is output to the wiring 14. By this charge pump circuit, one of the source current and the sink current is output in accordance with the output of the phase comparison circuit.

The capacitor 320 is a capacitor that converts the change in a current output from the charge pump circuit into a change in a voltage. The capacitor 320 is charged by a source current when the source current is supplied from the charge pump circuit, and is discharged by a sink current when the sink current is supplied from the charge pump circuit. The capacitor 320 outputs a signal of a voltage corresponding to the phase difference between the drive signal transmitted through the signal line 2 and the light-emission signal transmitted through the wiring 13. Note that the capacitor 320 constitutes a low-pass filter.

[Detection of Phase Difference]

Figure 7:
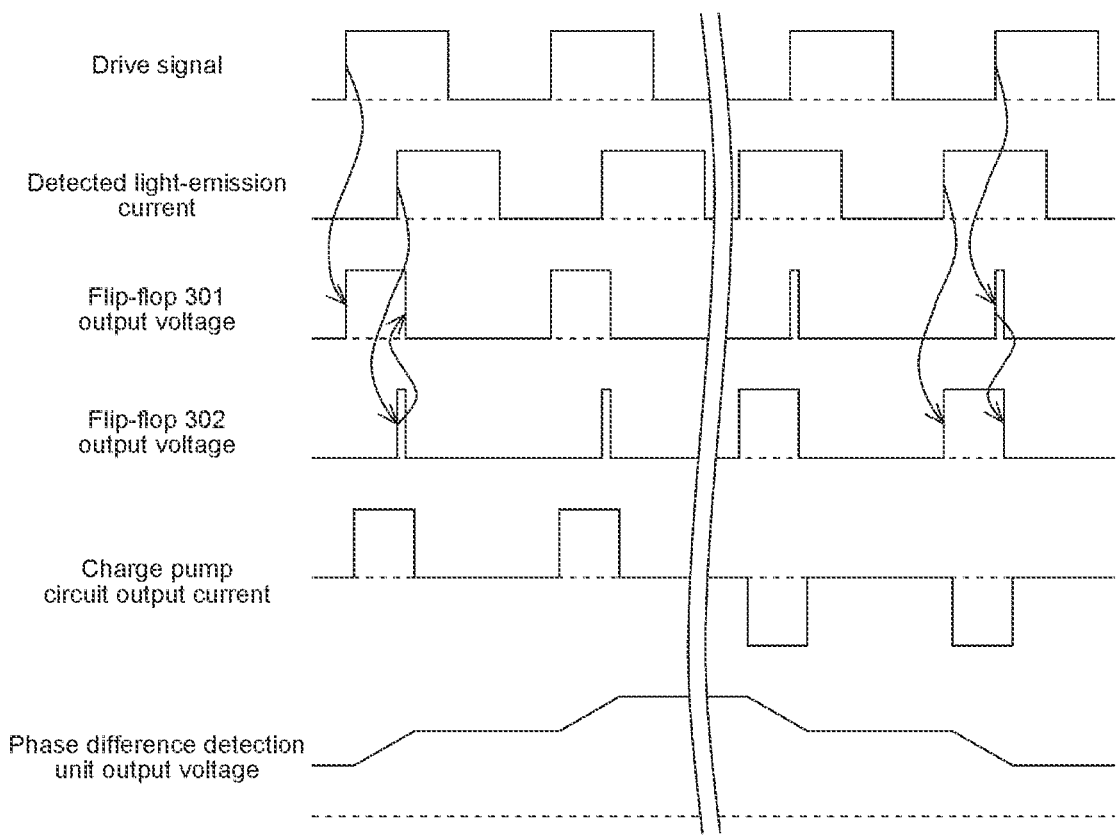
FIG. 7 is a diagram showing an example of detection of a phase difference according to the embodiment of the present disclosure.

FIG. 7 is a diagram showing an example of detection of a phase difference according to the embodiment of the present disclosure. FIG. 7 is a diagram showing an example of detection of a phase difference in the phase difference detection unit 300, and shows how the phase difference is detected. The "Drive signal" in the figure represents the waveform of the drive signal transmitted through the signal line 2. The "Detected light-emission current" in the figure represents the waveform of the output voltage of the inversion buffer 401 transmitted through the wiring 13, and represents the waveform of the signal corresponding to the light-emission current. The "flip-flop 301 output voltage" and the "flip-flop 302 output voltage" in the figure respectively represent the waveforms of the voltages of the Q outputs of the flip-flops 301 and 302. The "charge pump circuit output current" represents the waveform of the current output from the charge pump circuit to the wiring 14 described in FIG. 6. The "phase difference detection unit output voltage" in the figure represents the waveform of the voltage of the wiring 14.

The dotted line in the figure represents the level of "0" of the voltage or current. Further, the "drive signal", the "detected light-emission current", the "flip-flop 301 output voltage", and the "flip-flop 302 output voltage" represents binarized voltage waveforms. When the "drive signal" has a value "1", the light-emission current is supplied by the light-emission driving unit 110 of the drive unit 100. Further, when the current synchronized with the light-emission current is supplied in the simulation drive unit 120 of the drive unit 100, the "detected light-emission current" has a value "1". Further, the positive polarity and the negative polarity of the "charge pump circuit output current" respectively represent the supply of the source current and the sink current.

The left half of the waveform of the figure represents an example of the case where the detected light-emission current is in a lag phase with respect to the drive signal. The Q output of the flip-flop 301 has a value "1" in synchronization with the rising of the drive signal, and the Q output has a value "0" in synchronization with the rising of the detected light-emission current. When the source current is supplied during the period from the rising of the drive signal to the rising of the detected light-emission current, the capacitor 320 is charged and the output voltage of the phase difference detection unit 300 increases.

Meanwhile, the right half of the waveform in the figure represents an example of the case where the detected light-emission current is in a lead phase with respect to the drive signal. The Q output of the flip-flop 302 has a value "1" in synchronization with the rising of the detected light-emission signal, and the Q output has a value "0" in synchronization with the rising of the drive signal. When the sink current is supplied from the charge pump circuit during the period from the rising of the detected light-emission current to the rising of the drive signal, the capacitor 320 is discharged and the output voltage of the phase difference detection unit 300 is reduced. In this way, detection of a phase difference by the phase difference detection unit 300 is performed.

[Operation of Light-Emission Driving Device]

Figure 8:
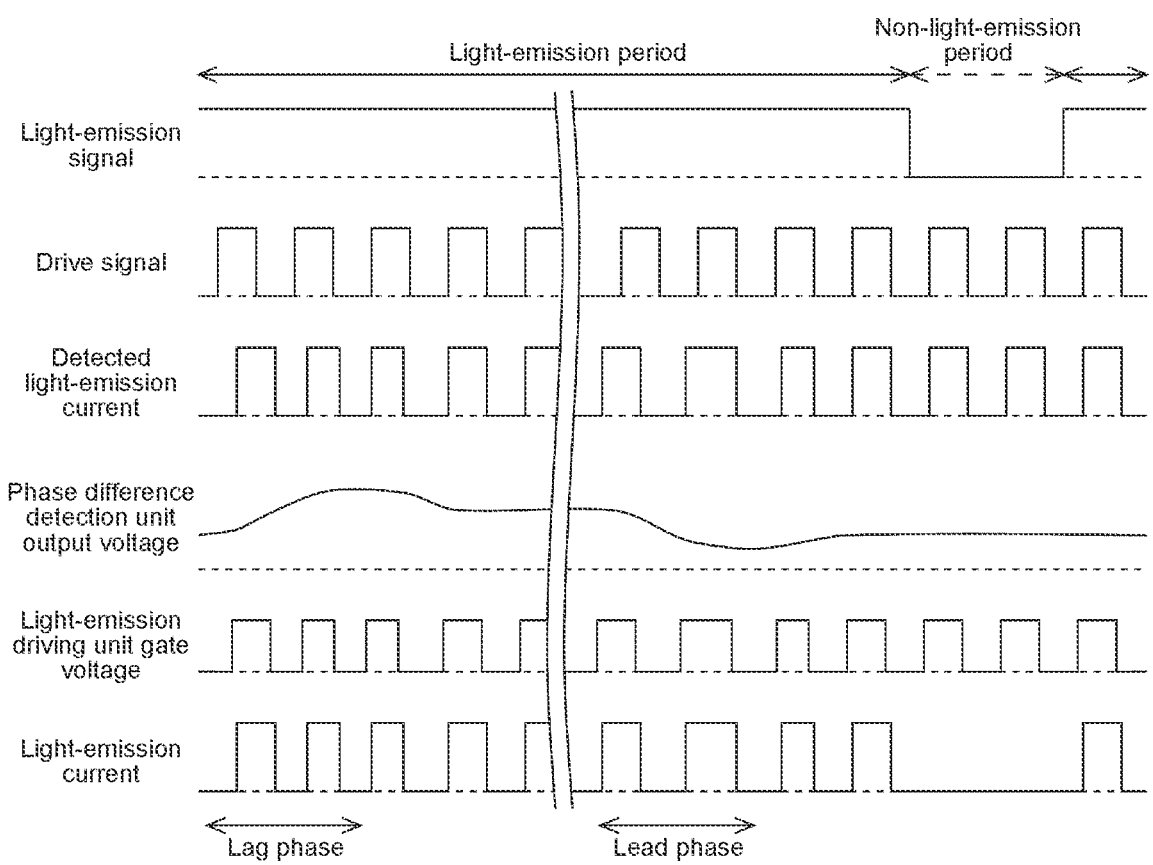
FIG. 8 is a diagram showing an example of an operation of a light-emission driving device according to the embodiment of the present disclosure.

FIG. 8 is a diagram showing an example of an operation of a light-emission driving device according to the embodiment of the present disclosure. FIG. 8 is a diagram showing an example of the operation of the light-emission driving device 10. The "light-emission signal" in the figure represents the waveform of the light-emission signal transmitted through the signal line 3. The periods in which this light-emission signal has values "1" and "0" respectively correspond to the light-emission period (solid arrow) and the non-light-emission period (dotted arrow). The "light-emission driving unit gate voltage" in the figure represents the waveform of the gate voltage of the MOS transistor 112 of the light-emission driving unit 110 described in FIG. 3. The "light-emission current" in the figure represents the waveform of the current supplied to the light-emitting element 20. Note that the same reference symbols are used for the portions common to those in FIG. 7.

In the light-emission period in the figure, the output voltage of the phase difference detection unit 300 increases or decreases in the case where the detected light-emission signal is in a lag phase and a lead phase with respect to the drive signal, respectively. As a result, the delay time of the delay unit 200 is adjusted, and the phase of the drive waveform of the gate of the MOS transistor 112 of the light-emission driving unit 110 is adjusted. It is possible to synchronize the drive signal and the light-emission current of the light-emitting element 20 with each other. Even in the case where the delay time of the drive signal has fluctuated due to the change in the power supply voltage of the light-emission driving device 10, the temperature, or the like, it is possible to synchronize the light-emission current of the light-emitting element 20 with the drive signal.

Further, when transitioning to the non-light-emission period, the MOS transistor 111 of the light-emission driving unit 110 enters the non-conductive state. For this reason, the light-emission current is not supplied to the light-emitting element 20 and the light emission is stopped. However, the inversion buffer 401 detects a light-emission current from the simulation drive unit 120, the DLL is capable of keeping the locked state. A gate drive signal synchronized with the drive signal is supplied to the gate of the MOS transistor 112 of the light-emission driving unit 110. For this reason, even immediately after transitioning from the non-light-emission period to the light-emission period, it is possible to keep the synchronization state of the drive signal and the light-emission current of the light-emitting element 20.

Note that the configuration of the light-emission driving device 10 is not limited to this example. For example, in the case where the drive signal transmitted through the signal line 2 is the negative logic, the logics of the light-emission signal detected from the simulation drive unit 120 and the drive signal are equal to each other, and thus, the inversion buffer 401 can be omitted. In this case, in the delay unit 200, there is a need to dispose an odd number of inverter circuits. Note that in this case, the wiring 12 constitutes a light-emission current detection unit.

As described above, the light-emission driving device 10 according to the first embodiment of the present disclosure detects a phase difference between the drive signal and the light-emission signal by the phase difference detection unit 300, and adjusts the delay time of the drive signal by the delay unit 200 in accordance with the detected phase difference. As a result, it is possible to synchronize the light emission of the light-emitting element 20 with the drive signal. It is possible to compensate for the delay of the light emission of the light-emitting element 20, and reduce errors in distance measurement.

2. Second Embodiment

The light-emission driving device 10 according to the above-mentioned first embodiment has supplied a light-emission current by the light-emission driving unit 110. Meanwhile, the light-emission driving device 10 according to a second embodiment of the present disclosure is different from that in the above-mentioned first embodiment in that a light-emission current is supplied by a plurality of light-emission driving units.

[Light-Emission Driving Device]

Figure 9:
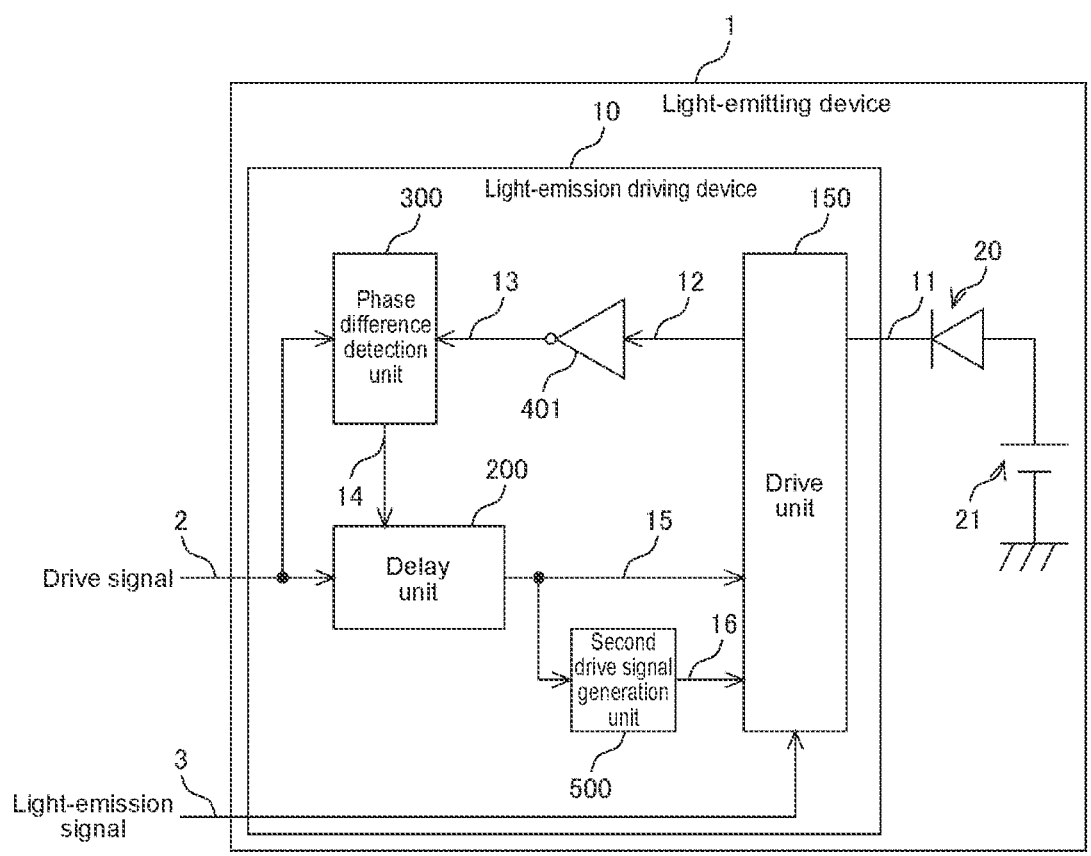
FIG. 9 is a diagram showing a configuration example of a light-emission driving device according to a second embodiment of the present disclosure.

FIG. 9 is a diagram showing a configuration example of a light-emission driving device according to the second embodiment of the present disclosure. FIG. 9 is a diagram showing a configuration example of the light-emitting device 1 and the light-emission driving device 10, similarly to FIG. 2. The light-emission driving device 10 is different from that described in FIG. 2 in that it includes a drive unit 150 instead of the drive unit 100 and further includes a second drive signal generation unit 500. The second drive signal generation unit 500 is for generating a second drive signal that is a drive signal of a second light-emission driving unit 130 disposed in the drive unit 150. A drive signal from the delay unit 200 is input to this second drive signal generation unit 500 via the wiring 15. Further, the second drive signal generated by the second drive signal generation unit 500 is supplied to the drive unit 150 via a wiring 16.

[Drive Unit]

Figure 10:
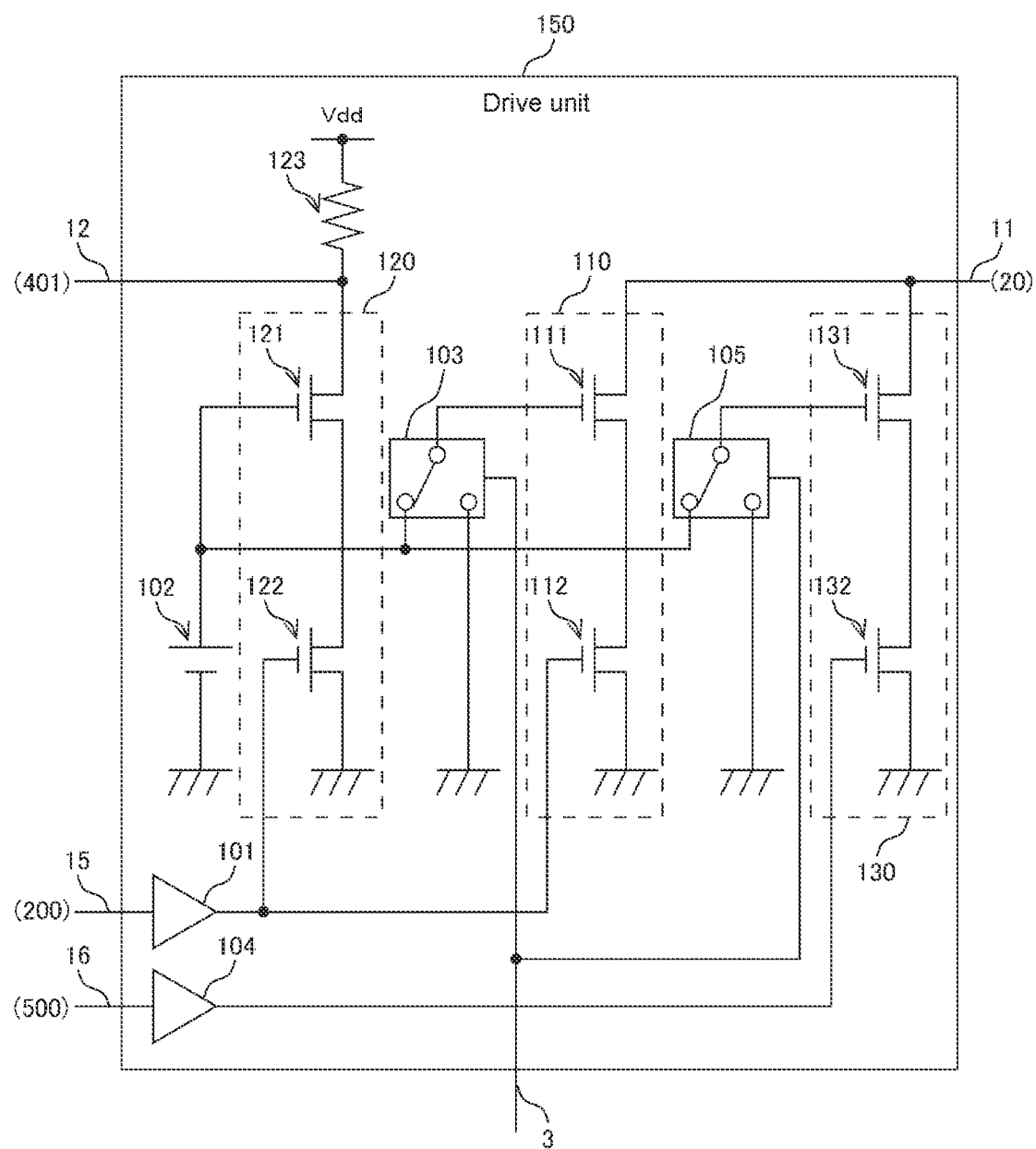
FIG. 10 is a diagram showing a configuration example of a drive unit according to the second embodiment of the present disclosure.

FIG. 10 is a diagram showing a configuration example of a drive unit according to the second embodiment of the present disclosure. FIG. 10 is a circuit diagram showing a configuration example of the drive unit 150. The drive unit 150 is different from the drive unit 100 described in FIG. 3 in that it further includes MOS transistors 131 and 132, a non-inversion buffer 104, and a selection unit 105. As the MOS transistors 131 and 132, n-channel MOS transistors can be used.

The input of the non-inversion buffer 104 is connected to the wiring 16, and the output of the non-inversion buffer 104 is connected to the gate of the MOS transistor 132. The source of the MOS transistor 132 is grounded, and the drain of the MOS transistor 132 is connected to the source of the MOS transistor 131. The drain of the MOS transistor 131 is connected to the wiring 11, and the gate of the MOS transistor 131 is connected to the output of the selection unit 105. The control input of the selection unit 105 is connected to the signal line 3. One input of the selection unit 105 is grounded, and the other input is connected to one end of the voltage source 102. Since the other connection is similar to that in the drive unit 100 described in FIG. 3, description thereof is omitted.

The MOS transistors 131 and 132 constitute the second light-emission driving unit 130. The MOS transistor 131 operates as a constant-current circuit similarly to the MOS transistor 111, and supplies a light-emission current together with the MOS transistor 111. The MOS transistor 132 controls the supply of the light-emission current similarly to the MOS transistor 112. This second light-emission driving unit 130 superimposes the light-emission current and supplies the superimposed light-emission current in a relatively short period when the supply of the light-emission current by the light-emission driving unit 110 is started. As a result, it is possible to make the laser beam applied from the light-emitting element 20 have a steep rise. Note that as the MOS transistor 131, a MOS transistor having the same channel width as that of the MOS transistor 111 can be used. In this case, the second light-emission driving unit 130 supplies a light-emission current having the same value as that of the light-emission driving unit 110. Meanwhile, by adjusting the channel width of the MOS transistor 131, it is also possible to make the drain current of the MOS transistor 131 have a value different from that of the drain current of the MOS transistor 111. In this case, it is possible to change the light-emission current of the second light-emission driving unit 130, and adjust the rising of the laser beam of the light-emitting element 20.

[Second Drive Signal Generation Unit]

Figure 11:
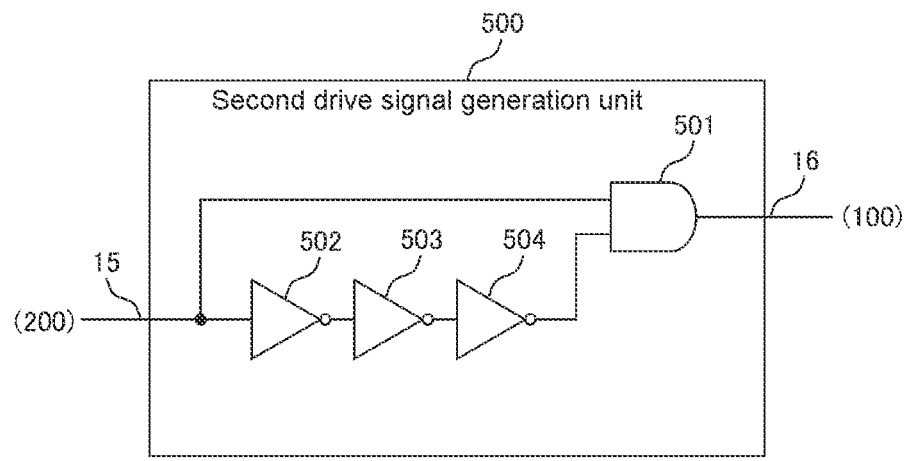
FIG. 11 is a diagram showing a configuration example of a second drive signal generation unit according to the second embodiment of the present disclosure.

FIG. 11 is a diagram showing a configuration example of a second drive signal generation unit according to the second embodiment of the present disclosure. FIG. 11 is a circuit diagram showing a configuration example of the second drive signal generation unit 500. The second drive signal generation unit 500 includes inversion gates 502 to 504 and an AND gate 501. One input of the AND gate 501 is connected to the wiring 15, and the other input is connected to the output of the inversion gate 504. The output of the AND gate 501 is connected to the wiring 16. The input of the inversion gate 502 is connected to the wiring 15, and the output of the inversion gate 502 is connected to the input of the inversion gate 503. The output of the inversion gate 503 is connected to the input of the inversion gate 504.

The inversion gates 502 to 504 are cascaded to delay the signal transmitted through the wiring 15 and invert the logic. By performing the AND operation on the delayed signal and the signal before delay, it is possible to generate a pulse voltage synchronized with the rising of the drive signal transmitted through the wiring 15. This pulse voltage is supplied as a second drive signal to the second light-emission driving unit 130.

[Driving of Light-Emitting Element]

Figure 12:
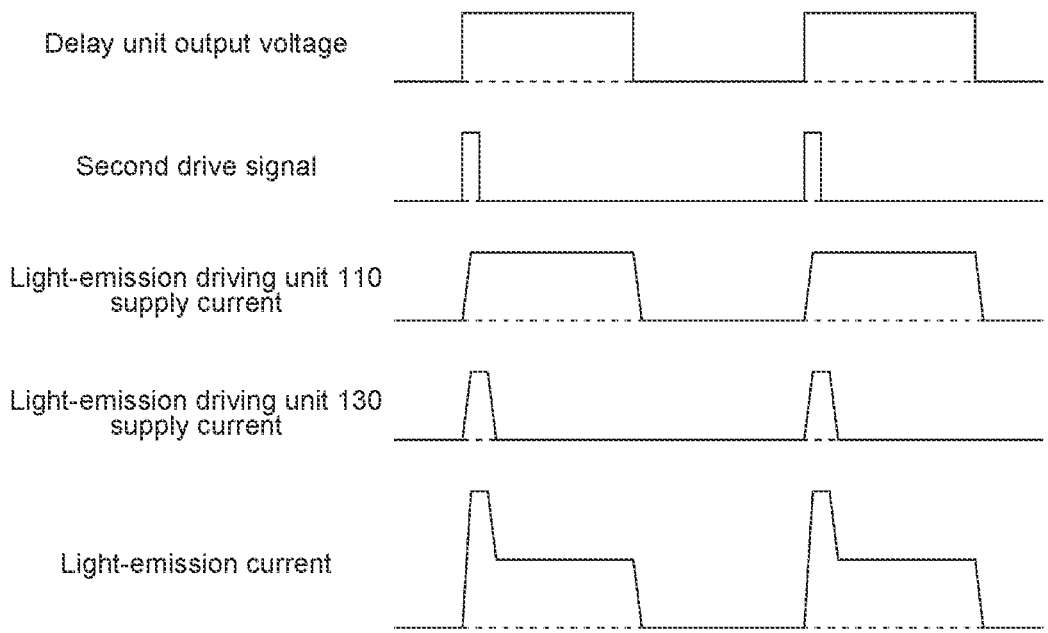
FIG. 12 is a diagram showing an example of driving of a light-emitting element according to the second embodiment of the present disclosure.

FIG. 12 is a diagram showing an example of driving of a light-emitting element according to the second embodiment of the present disclosure. FIG. 12 is a diagram showing an example of driving of the light-emitting element 20 in the light-emission driving device 10 according to the second embodiment of the present disclosure. The "delay unit output voltage" in the figure represents the drive signal output from the delay unit 200. The "second drive signal" represents the second drive signal generated by the second drive signal generation unit 500. The "light-emission driving unit 110 supply current" and the "light-emission driving unit 130 supply current" respectively represent currents supplied to the light-emitting element 20 by the light-emission driving unit 110 and the light-emission driving unit 130. The "light-emission current" represents the current of the light-emitting element 20.

As shown in the figure, the second drive signal generated by the second drive signal generation unit 500 is a pulsed drive signal synchronized with the rising of the drive signal whose delay time has been adjusted by the delay unit 200. The light-emission current by the second light-emission driving unit 130 is supplied on the basis of the second drive signal generated by the second drive signal generation unit 500. This light-emission current of the second light-emission driving unit 130 is superimposed on the light-emission current by the light-emission driving unit 110, and a substantially-double light-emission current flows in an early stage of when the light-emission of the light-emitting element 20 is started. This doubled light-emission current makes it possible to make the rising of application of a laser beam in the light-emitting element 20 faster.

Since the other configurations of the light-emission driving device 10 are similar to those of the light-emission driving device 10 described in the first embodiment of the present disclosure, description thereof is omitted.

As described above, the light-emission driving device 10 according to the second embodiment of the present disclosure includes the second light-emission driving unit 130 to increase the light-emission current when the light emission of the light-emitting element 20 is started. As a result, it is possible to make the rising of application of a laser beam of the light-emitting element 20 faster and improve the waveform of the laser beam to a rectangular shape.

3. Third Embodiment

In the light-emission driving device 10 according to the above-mentioned first embodiment, a drive signal has been transmitted through the signal line 2. Meanwhile, the light-emission driving device 10 according to a third embodiment of the present disclosure is different from that in the above-mentioned first embodiment in that a drive signal converted into a differential signal is transmitted.

[*Light-Emission Driving Device]

Figure 13:
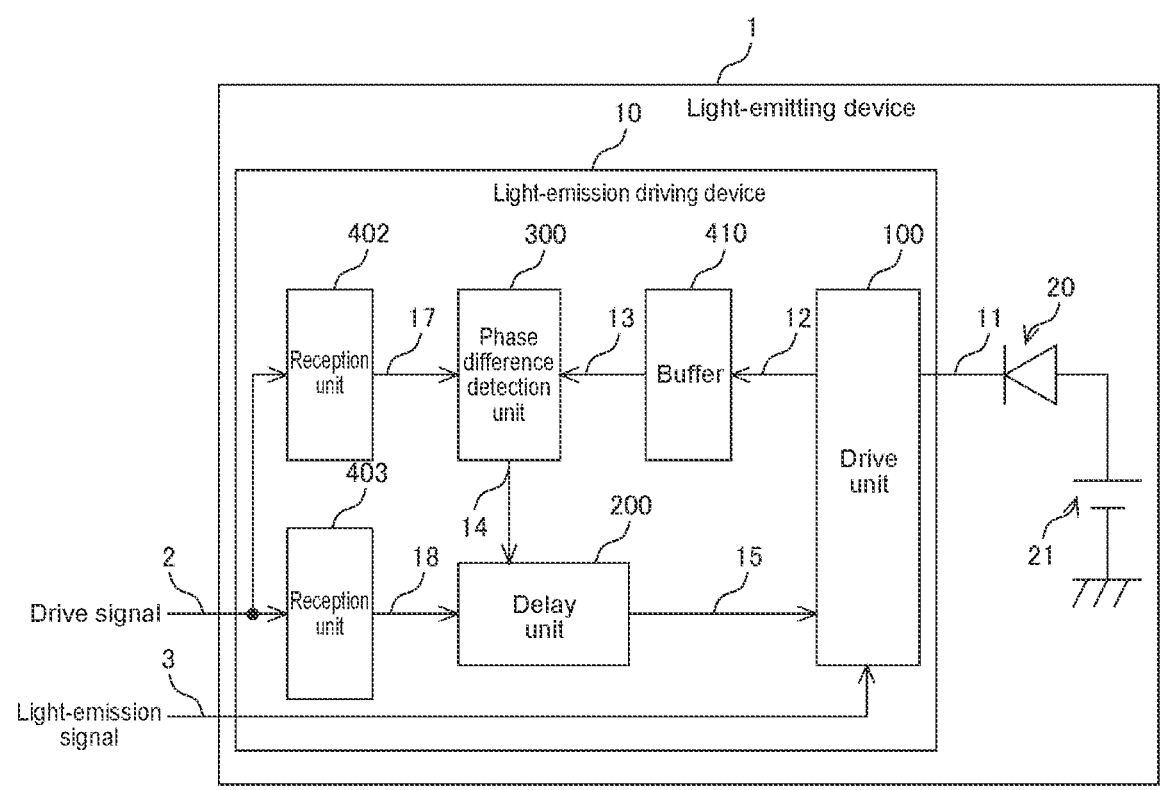
FIG. 13 is a diagram showing a configuration example of a light-emission driving device according to a third embodiment of the present disclosure.

FIG. 13 is a diagram showing a configuration example of a light-emission driving device according to the third embodiment of the present disclosure. FIG. 13 is a diagram showing a configuration example of the light-emitting device 1 and the light-emission driving device 10, similarly to FIG. 2. The light-emission driving device 10 is different from that described in FIG. 2 in that it further includes reception units 402 and 403 and a buffer 410 instead of the inversion buffer 401. Further, the signal line 2 includes a differential transmission line including two signal lines. Drive signals having phases opposite to each other are transmitted through the two signal lines. For the interface of this differential signal, for example, LVDS (Low Voltage Differential Signaling) can be employed. In this LVDS, a differential signal having an amplitude of 0.35 V is transmitted. 0 V corresponds to the logic of a low level and 0.35 V corresponds to the logic of a high level.

The reception units 402 and 403 each receive a drive signal that is converted into a differential signal and transmitted. The reception units 402 and 403 each convert the received drive signal into a single-ended drive signal of a signal level that can be input to the phase difference detection unit 300 and the like. The reception unit 402 performs, by a wiring 17, transmission of the converted drive signal to the phase difference detection unit 300, and the reception unit 403 performs, by a wiring 18, transmission of the converted drive signal to the delay unit 200. As the reception units 402 and 403, for example, LVDS receivers can be used.

The buffer 410 is a buffer that inverts the logic of the light-emission signal transmitted through the wiring 12 and outputs the inverted signal. As this buffer 410, the above-mentioned reception unit 402 or the like can be used. That is, it can be used as a buffer that converts the logic of the light-emission signal by the function of converting the differential signal of the reception unit 402 into a single-ended signal. Note that the buffer 410 and the wiring 12 are an example of the light-emission current detection unit described in the claims.

Figure 14:
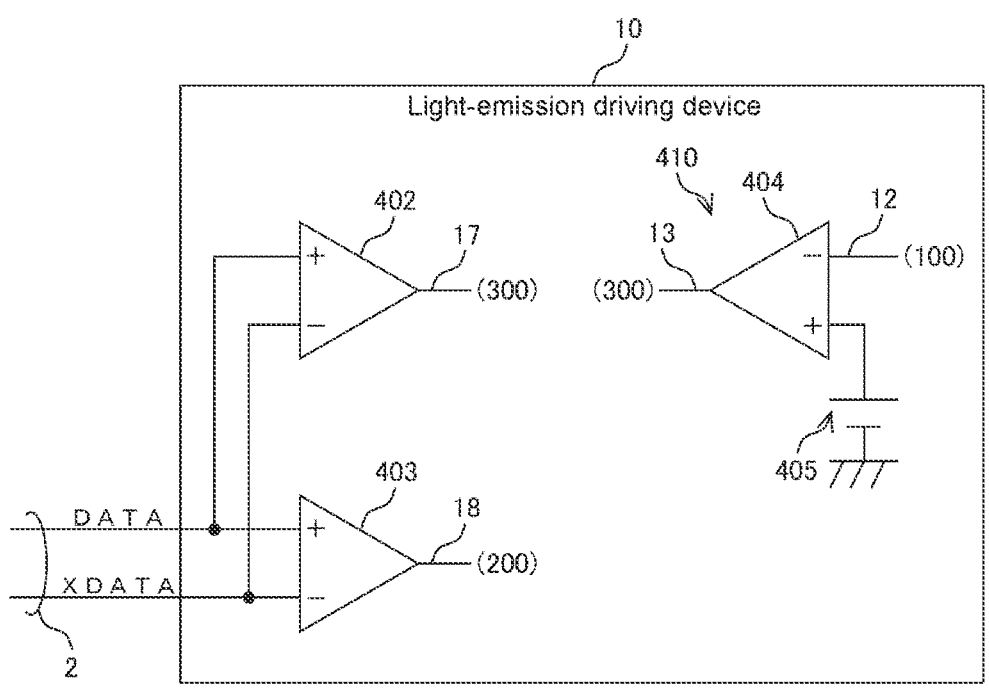
FIG. 14 is a circuit diagram showing a configuration example of the light-emission driving device according to the third embodiment of the present disclosure.

FIG. 14 is a circuit diagram showing a configuration example of a light-emission driving device according to the third embodiment of the present disclosure. FIG. 14 is a circuit diagram showing an arrangement example of the reception units 402 and 403 and the buffer 410, of the light-emission driving device 10. The signal line 2 in the figure includes a DATA signal line and an XDATA signal line. The DATA signal line transmits a signal having the same polarity as that of a drive signal, and the XDATA signal line transmits a signal obtained by converting the logic of a drive signal.

The non-inverting input of the reception unit 402 is connected to the DATA signal line, and the inverting input of the reception unit 402 is connected to the XDATA signal line. The output of the reception unit 402 is connected to the wiring 17. The non-inverting input of the reception unit 403 is connected to the DATA signal line, and the inverting input of the reception unit 403 is connected to the XDATA signal line. The output of the reception unit 403 is connected to the wiring 18. The reception units 402 and 403 respectively convert the drive signals in a differential signal format transmitted via the DATA signal line and the XDATA signal line. By providing the reception units 402 and 403 to transmit signals based on the LVDS, it is possible to perform transmission of a signal at high speed and with little influence of noise. However, since conversion of a differential signal is performed, delay time occurs from when a drive signal received by the reception units 402 and 403 to when the converted drive signal is output.

The buffer 410 in the figure includes a reception unit 404 and a voltage source 405. The inverting input of the reception unit 404 is connected to the wiring 12, and the output of the reception unit 404 is connected to the wiring 13. One end of the voltage source 405 is connected to the non-inverting input of the reception unit 404, and the other end of the voltage source 405 is grounded.

The reception unit 404 is for receiving a differential signal, converting the received signal into a single-ended signal, and outputting the converted signal, similarly to the above-mentioned reception units 402 and 403. Further, the voltage source 405 supplies a bias voltage to the non-inverting input of the reception unit 404. This bias voltage can be set to a middle voltage of the amplitude of the light-emission current input to the inverting input of the reception unit 404. By applying the middle voltage as a bias voltage to the non-inverting input, the reception unit 404 can be used as a buffer that inverts the logic of the signal input to the inverting input (detected light-emission current). Further, by disposing the reception unit 404 in a loop of the DLL, it is possible to compensate for the above-mentioned delay time due to the reception units 402 and 403. Even in the case where a drive signal is transmitted through a differential transmission line, it is possible to synchronize the light emission of the light-emitting element 20 with the drive signal.

Note that the configuration of the light-emitting device 1 is not limited to this example. For example, a signal line for transmitting a single-ended signal can be applied to the signal line 2.

Since the other configurations of the light-emission driving device 10 are similar to the configuration of the light-emission driving device 10 described in the first embodiment of the present disclosure, description thereof is omitted.

As described above, the light-emission driving device 10 according to the third embodiment of the present disclosure is capable of compensating for delay of the light emission of the light-emitting element 20 even in the case where a drive signal is transmitted through a differential transmission line.

4. Fourth Embodiment

In the light-emission driving device 10 according to the above-mentioned first embodiment, a light-emission current has been detected from the simulation drive unit 120 disposed in the drive unit 100. Meanwhile, the light-emission driving device 10 according to a fourth embodiment of the present disclosure is different from that in the above-mentioned first embodiment in that the simulation drive unit 120 is omitted.

[Drive Unit]

Figure 15:
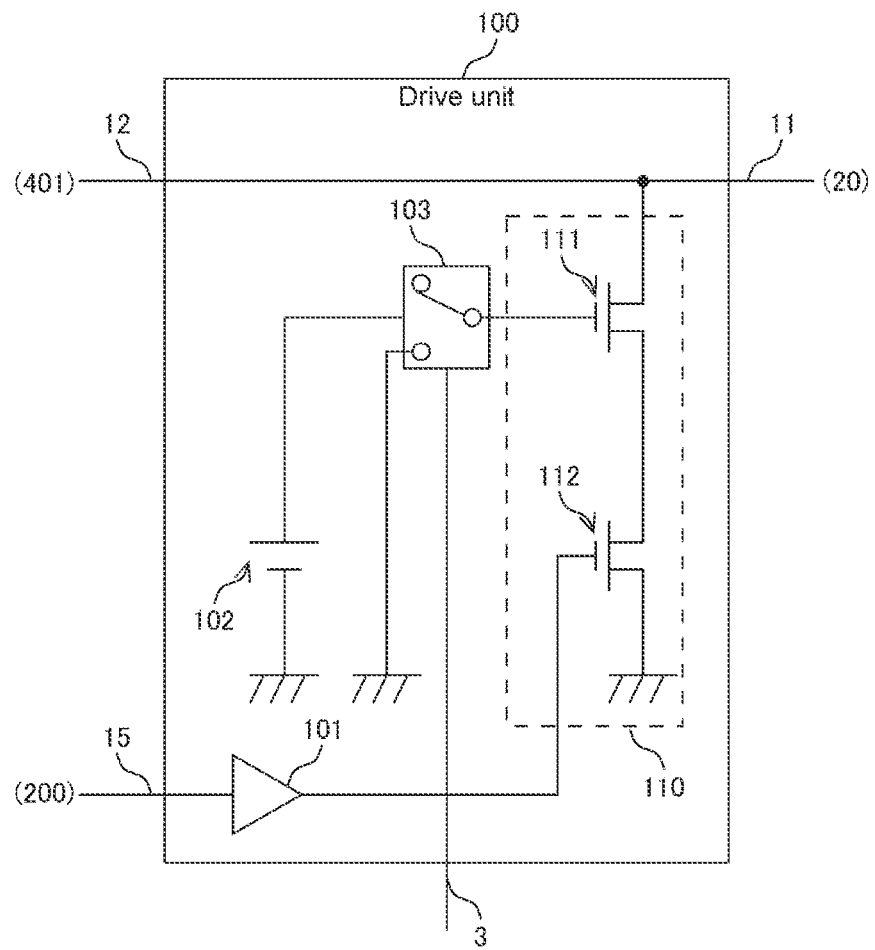
FIG. 15 is a diagram showing a configuration example of a drive unit according to a fourth embodiment of the present disclosure.

FIG. 15 is a diagram showing a configuration example of the drive unit 100 according to the fourth embodiment of the present disclosure. FIG. 15 is a circuit diagram showing a configuration example of the drive unit 100, similarly to FIG. 3. The drive unit 100 is different from that described in FIG. 3 in that the simulation drive unit 120 and the resistance 123 are omitted.

In the drive unit 100 in the figure, the wiring 12 is connected to the drain of the MOS transistor 111. Since the other connection is similar to that in the drive unit 100 in FIG. 3, description thereof is omitted.

The wiring 12 is connected to the wiring 11 that is the node connecting the drain of the MOS transistor 111 and the light-emitting element 20 to each other. As a result, a light-emission current is detected from the light-emission driving device 10. For this reason, in the non-light-emission period, the light-emission current cannot be detected. Immediately after transitioning to the light-emission period, the phase difference between the drive signal and the light-emission current increases. There is a need to delay the distance measurement until the drive signal and the light-emission signal are in the synchronization state.

Since the other configurations of the light-emission driving device 10 are similar to the configuration of the light-emission driving device 10 described in the first embodiment of the present disclosure, description thereof is omitted.

As described above, the light-emission driving device 10 according to the fourth embodiment of the present disclosure detects the light-emission current from the wiring 11 between the light-emitting element 20 and the light-emission driving unit 110. It is possible to omit the simulation drive unit 120 and simplify the configuration of the light-emission driving device 10.

5. Application Example to Camera

The technology according to the present disclosure (the present technology) is applicable to various products. For example, the present technology may be realized as an image sensor mounted on an imaging apparatus such as a camera.

Figure 16:
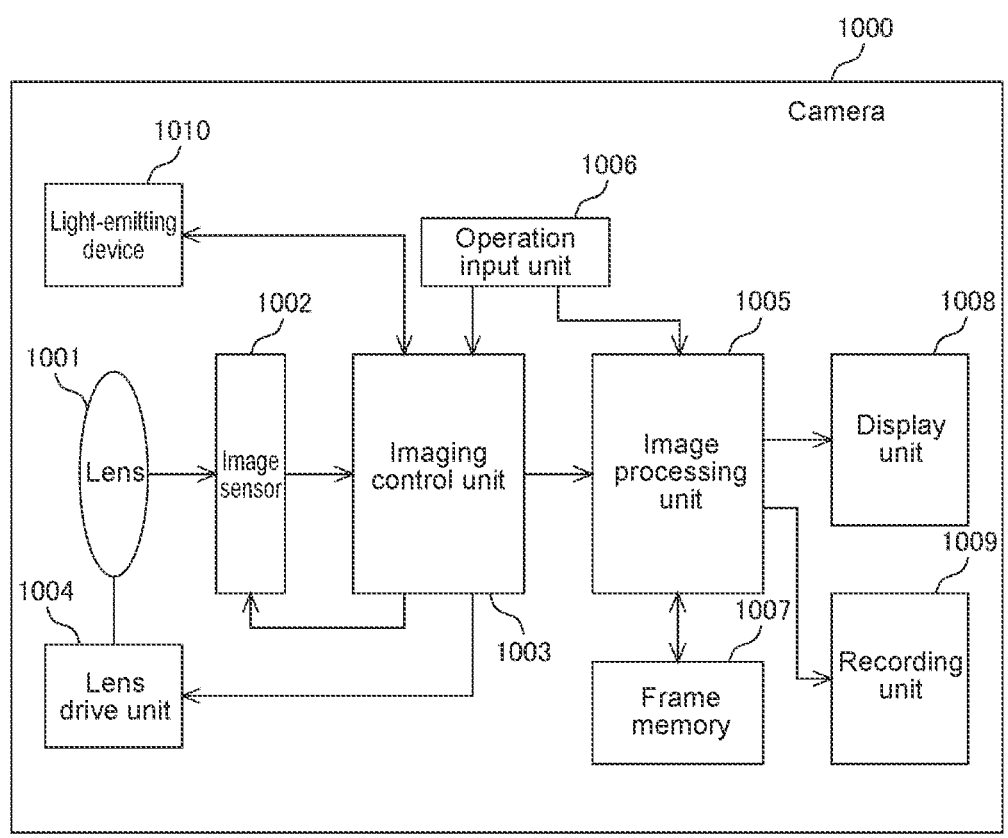
FIG. 16 is a block diagram illustrating an example of a schematic configuration of a camera that is an example of an imaging apparatus to which the present technology may be applied.

FIG. 16 is a block diagram illustrating an example of a schematic configuration of a camera that is an example of an imaging apparatus to which the present technology may be applied. A camera 1000 in the figure includes a lens 1001, an image sensor 1002, an imaging control unit 1003, a lens drive unit 1004, an image processing unit 1005, an operation input unit 1006, a frame memory 1007, a display unit 1008, a recording unit 1009, and a light-emitting device 1010.

The lens 1001 is an imaging lens of the camera 1000. This lens 1001 collects light from a subject, and causes the collected light to enter the image sensor 1002 described below to form an image of the subject.

The image sensor 1002 is a semiconductor device that images the light from the subject that is collected by the lens 1001. This image sensor 1002 generates an analog image signal corresponding to the applied light, and converts the analog image signal into a digital image signal to output the digital image signal.

The imaging control unit 1003 controls imaging performed by the image sensor 1002. This imaging control unit 1003 performs control of the image sensor 1002 by generating a control signal and outputting the control signal to the image sensor 1002. Further, the imaging control unit 1003 is capable of performing autofocusing in the camera 1000 on the basis of the image signal output from the image sensor 1002. Here, the autofocusing is a system that detects a focal position of the lens 1001 and automatically adjusts the focal position. It is possible to use, as the autofocusing, a method of detecting a focal position by detecting an image-plane phase difference using a phase difference pixel disposed in the image sensor 1002 (image-plane-phase-difference autofocusing). Further, it is also possible to apply a method (contrast autofocusing) that includes detecting, as the focal position, a position in which an image exhibits a highest contrast. The imaging control unit 1003 adjusts the position of the lens 1001 through the lens drive unit 1004 on the basis of the detected focal position, and performs autofocusing. Note that the imaging control unit 1003 can include, for example, a digital signal processor (DSP) on which firmware is mounted.

The lens drive unit 1004 drives the lens 1001 on the basis of control performed by the imaging control unit 1003. This lens drive unit 1004 is capable of driving the lens 1001 by changing the position of the lens 1001 using a built-in motor.

The image processing unit 1005 processes the image signal generated by the image sensor 1002. Demosaicking for generating an image signal of an insufficient color among image signals corresponding to red, green, and blue for each pixel, noise reduction for removing noise from an image signal, encoding of an image signal, and the like correspond to this processing. The image processing unit 1005 can include, for example, a microcomputer on which firmware is mounted.

The operation input unit 1006 receives an operation input from a user of the camera 1000. As this operation input unit 1006, for example, a push button or a touch panel can be used. An operation input received by the operation input unit 1006 is transmitted to the imaging control unit 1003 and the image processing unit 1005. After that, the processing corresponding to the operation input, e.g., processing such as imaging a subject is started.

The frame memory 1007 is a memory that stores therein a frame that is an image signal for a single screen. This frame memory 1007 is controlled by the image processing unit 1005, and holds a frame in the process of image processing.

The display unit 1008 displays thereon an image processed by the image processing unit 1005. As this display unit 1008, for example, a liquid crystal panel can be used.

The recording unit 1009 records therein an image processed by the image processing unit 1005. As this recording unit 1009, for example, a memory card or a hard disk can be used.

The light-emitting device 1010 emits a laser beam for measuring a distance to a subject. Further, the above-mentioned imaging control unit 1003 further controls the light-emitting device 1010 and measures a distance to the subject. The measurement of the distance to the subject in the camera 1000 can be performed as follows. First, the imaging control unit 1003 controls the light-emitting device 1010 to emit a laser beam. Next, the laser beam reflected by the subject is detected by the image sensor 1002. Next, the imaging control unit 1003 measures the time from the mission of a laser beam in the light-emitting device 1010 to the detection of the laser beam in the image sensor 1002 to calculate the distance to the subject.

The camera to which the present disclosure may be applied has been described above. The present technology is applicable to the light-emitting device 1010 of the configurations described above. Specifically, the light-emitting device 1 described in FIG. 1 can be applied to the light-emitting device 1010. By applying the light-emitting device 1 to the light-emitting device 1010, it is possible to reduce errors in distance measurement.

Note that although a camera has been described here as an example, the technology according to the present invention may be applied to, for example, a mobile device, an unmanned conveyance vehicle, or the like in addition to the camera.

Finally, the description of the above-mentioned embodiments is an example of the present disclosure, and the present disclosure is not limited to the above-mentioned embodiments. Therefore, it goes without saying that various modifications can be made depending on the design and the like without departing from the technical idea according to the present disclosure even in the case of an embodiment other than the above-mentioned embodiments.

Further, the drawings in the above-mentioned embodiments are schematic, and the ratio of the dimensions of the respective units and the like do not necessarily coincide with real ones. Further, it goes without saying that the drawings have different dimensional relationships and different ratios of dimensions with respect to the same portion.

It should be noted that the present technology may take the following configurations.

(1) A light-emission driving device, including:
a light-emission current detection unit that detects a light-emission current for causing a light-emitting element to emit light, the light-emission current being supplied from a light-emission driving unit;
a phase difference detection unit that detects a phase difference between the detected light-emission current and a drive signal for controlling the supply of the light-emission current in the light-emission driving unit; and
a delay unit that adjusts propagation delay of the drive signal in accordance with the detected phase difference, and supplies the adjusted drive signal to the light-emission driving unit as a drive signal.

(2) The light-emission driving device according to (1) above, further including
a simulation drive unit that is controlled by the adjusted drive signal to supply a current that is substantially synchronized with the light-emission current, in which
the light-emission current detection unit detects the light-emission current by detecting the current supplied from the simulation drive unit.

(3) The light-emission driving device according to (2) above, in which
the light-emission driving unit stops the supply of the light-emission current in a non-light-emission period that is a period in which light emission of the light-emitting element is stopped.

(4) The light-emission driving device according to any one of (1) to (3) above, in which
the delay unit is configured by cascading a plurality of delay circuits in which time of the propagation delay changes depending on the phase difference.

(5) The light-emission driving device according to any one of (1) to (4) above, further including
a second light-emission driving unit that is connected to the light-emission driving unit in parallel to supply a second light-emission current to the light-emitting element.

(6) The light-emission driving device according to (5) above, further including
a second drive signal generation unit that generates, on a basis of the adjusted drive signal, a second drive signal that is a drive signal of the second light-emission driving unit.

(7) The light-emission driving device according to any one of (1) to (6) above, further including
a reception unit that receives the drive signal transmitted through a signal line and outputs the received drive signal, in which
the phase difference detection unit detects a difference between the detected light-emission current and the drive signal output from the reception unit, and
the delay unit adjusts delay of the drive signal output from the reception unit.

(8) The light-emission driving device according to (7) above, in which
the signal line transmits the drive signal converted into a differential signal, and
the reception unit receives the transmitted drive signal converted into a differential signal.

(9) The light-emission driving device according to (7) above, in which
the light-emission current detection unit includes a buffer circuit having substantially the same delay time as output delay time of driving in the reception unit.

(10) A light-emitting device, including:
a light-emitting element;
a light-emission driving unit that supplies a light-emission current for causing the light-emitting element to emit light;
a light-emission current detection unit that detects the supplied light-emission current;
a phase difference detection unit that detects a phase difference between the detected light-emission current and a drive signal for controlling the supply of the light-emission current in the light-emission driving unit; and
a delay unit that adjusts propagation delay of the drive signal in accordance with the detected phase difference, and supplies the adjusted drive signal to the light-emission driving unit as a drive signal.

REFERENCE SIGNS LIST 1 light-emitting device
2, 3 signal line
10 light-emission driving device
11 to 18 wiring
20 light-emitting element
100, 150 drive unit
110 light-emission driving unit
120 simulation drive unit
130 second light-emission driving unit
200 delay unit
210, 220, 240, 250 inverter circuit
300 phase difference detection unit
401 inversion buffer
402 to 404 reception unit
410 buffer
500 second drive signal generation unit
1000 camera
1003 imaging control unit
1010 light-emitting device

The invention claimed is:
1. A light-emission driving device, comprising:
a reception unit configured to:
  receive a first drive signal through a signal line;
  convert the received first drive signal into a second drive signal; and
  output the second drive signal, wherein the output of the second drive signal is delayed by a first delay time based on the conversion of the received first drive signal into the second drive signal;
a first light-emission driving unit configured to:
  supply a first light-emission current to a light-emitting element, wherein the light-emitting element emits light based on the supplied first light-emission current;
  receive a third drive signal; and
  control the supply of the first light-emission current based on the third drive signal;
a light-emission current detection unit configured to detect the first light-emission current, wherein
  the light-emission current detection unit includes a buffer circuit, and
  the buffer circuit has a second delay time that is same as the first delay time;
a phase difference detection unit configured to:
  receive the second drive signal; and
  detect a phase difference between the detected first light-emission current and the second drive signal;
a delay unit configured to:
  adjust a propagation delay of the second drive signal based on the detected phase difference; and
  supply the adjusted second drive signal, as the third drive signal, to the first light-emission driving unit; and
a simulation drive unit configured to:
  generate a synchronized current based on the adjusted second drive signal, wherein the synchronized current is synchronized with the first light-emission current; and
  supply the synchronized current to the light-emission current detection unit, wherein the light-emission current detection unit is further configured to:
  detect the supplied synchronized current; and
  detect the first light-emission current based on the detection of the synchronized current.

2. The light-emission driving device according to claim 1, wherein
  the first light-emission driving unit is further configured to stop the supply of the first light-emission current in a non-light-emission period, and
  light emission of the light-emitting element is stopped in the non-light-emission period.

3. The light-emission driving device according to claim 1, wherein
  the delay unit includes a plurality of delay circuits,
  each delay circuit of the plurality of delay circuits is cascaded with at least one delay circuit of the plurality of delay circuits,
  the plurality of delay circuits is configured to change a time of the propagation delay of the second drive signal, and
  the change of the time of the propagation delay is based on the detected phase difference.

4. The light-emission driving device according to claim 1, further comprising a second light-emission driving unit configured to supply a second light-emission current to the light-emitting element.

5. The light-emission driving device according to claim 4, further comprising a drive signal generation unit configured to generate a fourth drive signal based on the adjusted second drive signal, wherein the second light-emission driving unit is further configured to supply the second light-emission current based on the fourth drive signal.

6. The light-emission driving device according to claim 1, wherein the first drive signal is a differential signal.

7. A light-emitting device, comprising:
a light-emitting element;
a reception unit configured to:
  receive a first drive signal through a signal line;
  convert the received first drive signal into a second drive signal; and
  output the second drive signal, wherein the output of the second drive signal is delayed by a first delay time based on the conversion of the received first drive signal into the second drive signal;
a light-emission driving unit configured to:
  supply a light-emission current to the light-emitting element, wherein the light-emitting element is configured to emit light based on the supplied light-emission current;
  receive a third drive signal; and
  control the supply of the light-emission current based on the third drive signal;
a light-emission current detection unit configured to detect the light-emission current, wherein
  the light-emission current detection unit includes a buffer circuit, and
  the buffer circuit has a second delay time that is same as the first delay time;
a phase difference detection unit configured to:
  receive the second drive signal; and
  detect a phase difference between the detected light-emission current and the second drive signal;
a delay unit configured to:
  adjust a propagation delay of the second drive signal based on the detected phase difference; and
  supply the adjusted second drive signal, as the third drive signal, to the light-emission driving unit; and a simulation drive unit configured to:
  generate a synchronized current based on the adjusted second drive signal, wherein the synchronized current is synchronized with the light-emission current; and
  supply the synchronized current to the light-emission current detection unit, wherein the light-emission current detection unit is further configured to:
    detect the supplied synchronized current; and
    detect the light-emission current based on the detection of the synchronized current.

8. A light-emission driving device, comprising:
a reception unit configured to:
  receive a first drive signal through a signal line, wherein the first drive signal is a differential signal;
  convert the received first drive signal into a second drive signal; and
  output the second drive signal, wherein the output of the second drive signal is delayed by a first delay time based on the conversion of the received first drive signal into the second drive signal;
a light-emission driving unit configured to:
  supply a light-emission current to a light-emitting element, wherein the light-emitting element emits light based on the supplied light-emission current;
  receive a third drive signal; and
  control the supply of the light-emission current based on the third drive signal;
a light-emission current detection unit configured to detect the light-emission current, wherein
  the light-emission current detection unit includes a buffer circuit, and
  the buffer circuit has a second delay time that is same as the first delay time;
a phase difference detection unit configured to:
  receive the second drive signal; and
  detect a phase difference between the detected light-emission current and the second drive signal;
a delay unit configured to:
  adjust a propagation delay of the second drive signal based on the detected phase difference; and
  supply the adjusted second drive signal, as the third drive signal, to the light-emission driving unit.

* * * * *